(12) United States Patent
Bardsley et al.

(10) Patent No.: US 7,852,151 B2
(45) Date of Patent: *Dec. 14, 2010

(54) VARIABLE GAIN AMPLIFIER

(75) Inventors: Thomas J. Bardsley, Poughkeepsie, NY (US); Matthew R. Cordrey-Gale, Hampshire (GB); James S. Mason, Hampshire (GB); Philip J. Murfet, Hampshire (GB); Gareth J. Nickolls, Hampshire (GB)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/130,453

(22) Filed: May 30, 2008

(65) Prior Publication Data

US 2008/0284517 A1 Nov. 20, 2008

Related U.S. Application Data

(63) Continuation of application No. 11/734,864, filed on Apr. 13, 2007, now Pat. No. 7,397,302, which is a continuation of application No. 11/096,854, filed on Apr. 1, 2005, now Pat. No. 7,250,814.

(30) Foreign Application Priority Data

Apr. 3, 2004 (GB) ................................. 0407663.4

(51) Int. Cl.
 *H03F 1/14* (2006.01)
(52) U.S. Cl. ..................................... 330/51; 330/124 R
(58) Field of Classification Search ................... 330/51, 330/124 R, 295, 84, 126, 254
See application file for complete search history.

(56) References Cited

U.S. PATENT DOCUMENTS

| | | | | |
|---|---|---|---|---|
| 4,395,687 A | * | 7/1983 | Belohoubek | ................ 333/164 |
| 6,512,416 B2 | | 1/2003 | Burns et al. | |
| 6,678,506 B1 | * | 1/2004 | Dolman et al. | ........... 455/127.3 |
| 6,696,893 B2 | * | 2/2004 | Burns et al. | ................. 330/129 |
| 7,355,470 B2 | * | 4/2008 | Sorrells et al. | ................. 330/2 |
| 2002/0021169 A1 | * | 2/2002 | King et al. | .................... 330/51 |

* cited by examiner

*Primary Examiner*—Henry K Choe
(74) *Attorney, Agent, or Firm*—Lieberman & Brandsdorfer, LLC

(57) ABSTRACT

A method of varying the gain of an amplifier and an amplifier array are provided. The amplifier array includes two or more amplifier stages (201, 202) connected in parallel with each amplifier stage having a gain control means. Input signal means (203, 204) are provided for each amplifier stage with the input signals of the amplifier stages being of different amplitude. Means for enabling and disabling an amplifier stage (216) are provided and means for summing the outputs of the enabled amplifier stages obtain an output signal (212). The gain of the amplifier array has a range from a low gain setting with a first amplifier stage (202) enabled, through increasing gain settings as the gain of the first amplifier stage is increased from a minimum to a maximum gain, a second amplifier stage (201) can then be enabled in addition to the first amplifier stage and the gain of the second amplifier stage increased from a minimum to a maximum gain, further amplifier stages are enabled as available up to a maximum gain setting for the amplifier array. Each amplifier stage that is enabled has a decreasingly attenuated input signal and a final amplifier stage to be enabled has a full input signal (203).

17 Claims, 9 Drawing Sheets

VARIABLE GAIN AMPLIFIER

CROSS REFERENCE TO RELATED APPLICATION(S)

The present application is a continuation of U.S. patent application Ser. No. 11/734,864 filed on Apr. 13, 2007, which is a continuation of U.S. patent application Ser. No. 11/096,854 filed on Apr. 1, 2005, now U.S. Pat. No. 7,250,814, both of which are hereby incorporated by reference.

BACKGROUND OF THE INVENTION

1. Technical Field

This invention relates to the field of variable gain amplifiers. In particular, the invention relates to variable gain amplifiers for low voltage and high frequency operation.

2. Description of the Prior Art

A variable gain amplifier (VGA) is often used in automatic gain control (AGC) applications and often needs to cover a gain range where it is attenuating, with a gain of less than 1, and amplifying, with a gain of greater than 1. Modern integrated circuit applications for VGA circuits are requiring increased operating frequencies, low supply voltages and relatively high input signal levels (at the low gain settings).

U.S. Pat. No. 6,512,416 to Burns et al. discloses a variable gain amplifier for use in a cable television system. An extended range of variable gain amplifier is achieved switching in parallel amplifiers in an architecture. There is no gain adjustment within the individual amplifier blocks of the architecture, the gain adjustment is achieved by switching amplifiers in and out of circuit. There is mention of varying the gain by adjusting the tail current which has several disadvantages, notably the maximum output swing is also changed and the frequency performance varies a lot.

The '416 patent also requires a large number of amplifier blocks which results in a high capacitive loading at the summing node which requires the addition of inductors. The need to use such components on a chip is undesirable due to the large silicon area that they occupy, increasing the cost of the solution.

Serial link technology is becoming pervasive in the majority of system to system, system to peripheral or local inter computer connections, replacing parallel bus connections. A variable gain amplifier is an important part of serial link technology and a solution is particularly required for high frequency applications where high input voltages can be processed with the low supply of sub-micron CMOS (complementary metal oxide semiconductor) integrated circuit processes. Therefore, it is an aim of the present invention to provide a variable gain amplifier solution suited for low voltage and high frequency applications.

SUMMARY OF THE INVENTION

This invention comprises a method and apparatus for varying gain of an amplifier array.

In one aspect of the invention, a method is provided for varying gain of an amplifier array. A first amplifier stage having an input signal with a first amplitude is enabled. Gain of the first amplifier stage is controlled to increase the gain up to a maximum for the first amplifier stage. A second amplifier stage having an input signal with a second amplitude is enabled. The second amplifier stage is in parallel with the first amplifier stage. In addition, the first amplitude of the first amplifier stage signal is different from the second amplitude of the second amplifier stage. Gain of the second amplifier stage is controlled to increase the gain up to a maximum. The outputs of the enabled amplifier stages are summed together.

In another aspect of the invention, an amplifier array is provided. The array includes at least two amplifier stages connected in parallel. Each of the amplifier stages has a gain controller. An input signal for each amplifier stage is provided, with each of the input signals being of different amplitude. In addition, an enabler and a disabler is provided for each amplifier stage. A tool to aggregate outputs of the enabled amplifier stages is provided to obtain an output signal, and a control law is implemented for amplitude gain versus a control characteristic of gain.

In yet another aspect, an amplifier array is provided with an enabled first amplifier stage in parallel with an enabled second amplifier stage. A first input signal for the first amplifier stage is provided having a first amplitude, and a second input signal for the second amplifier stage is provided having a second amplitude. The first and second amplitudes are different. In addition, a gain controller is provided for each amplifier stage. A output signal is produced reflective of each output of each of the enabled amplifier stages.

In an even further aspect, an article of manufacture is provided. The article includes an amplifier array with at least two amplifier stages connected in parallel. Each of the amplifiers stages has a gain control means, with at least one of the gain control means being a digital gain vector to obtain an output. In addition, input signal means are provided for each amplifier stage with each input signal of each of the amplifier stage having a different amplitude. Means are also provided for enabling and disabling each of said amplifier stages, and for summing output of the enabled amplifiers stages to obtain an output signal.

Other features and advantages of this invention will become apparent from the following detailed description of the presently preferred embodiment of the invention, taken in conjunction with the accompanying drawings.

DESCRIPTION OF THE PREFERRED EMBODIMENT

Figure 1A:
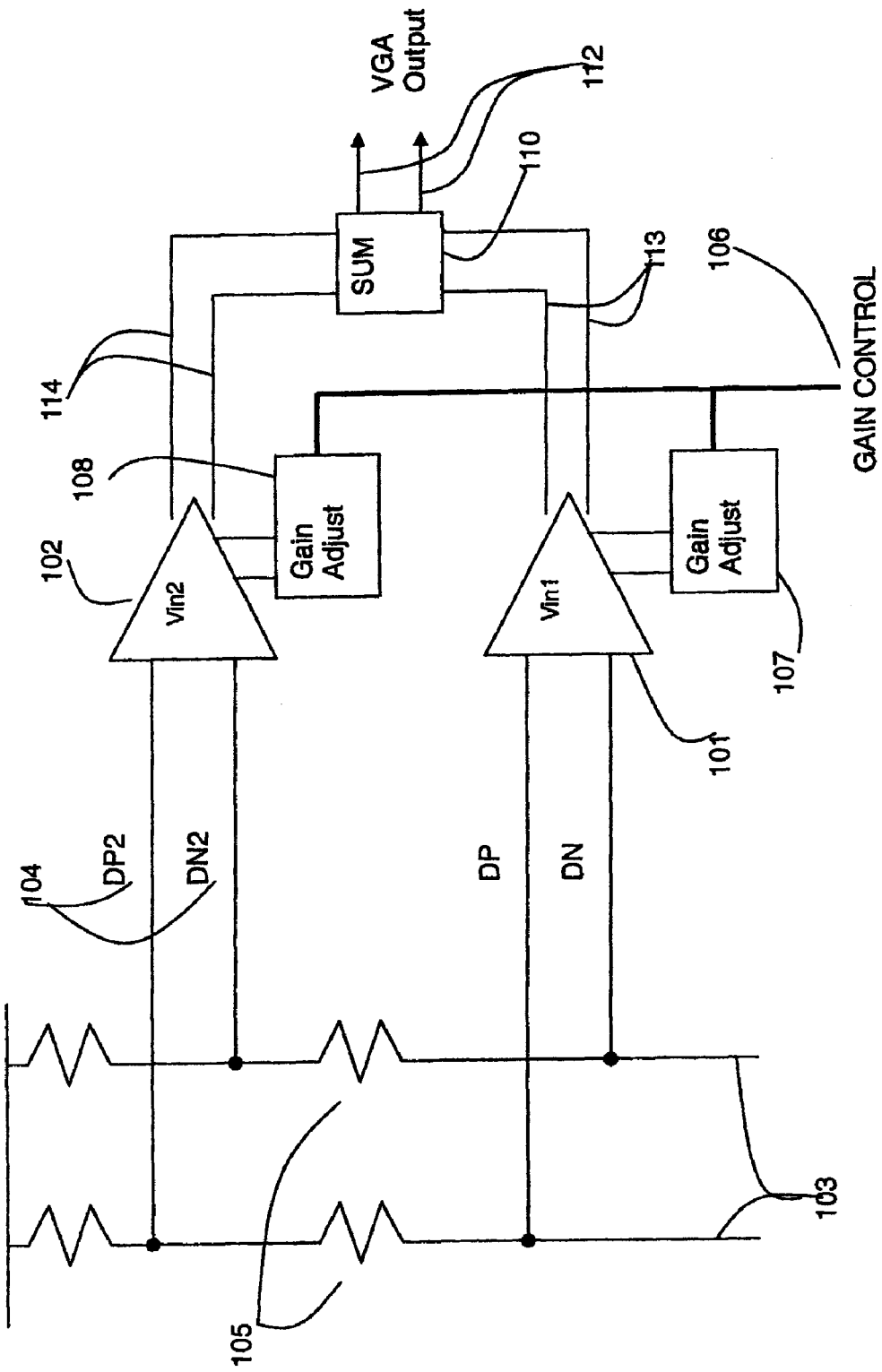
FIG. 1A is a schematic diagram of a variable gain amplifier in accordance with the present invention.

A basic variable gain amplifier (VGA) architecture 100 is shown in FIG. 1A. The VGA 100 employs a multipath amplifier arrangement. A first amplifier 101 uses a full size input signal 103 and a second amplifier 102 uses an attenuated form 104 of this input signal 103. A resistor input network 105 is used to attenuate the input signal 103 to provide the attenuated form 104 for the input signal to the second amplifier 102. In place of a resistor input network, a line termination or a parallel divider network could be used.

Each of the first and second amplifiers 101, 102 has a gain adjustment means 107, 108 which is controlled by a gain control network 106. The outputs 113, 114 of the first and second amplifiers 101, 102 are summed by summer 110 to provide the overall output 112 of the VGA 100.

At low gain settings which cover the gain range where the VGA 100 is attenuating, the second amplifier 102 using the attenuated form 104 of the input signal 103 is active with the first, full signal amplifier 101 disabled.

As the gain of the VGA 100 is increased, the gain of the second amplifier 102 is increased through the gain control network 106. When this second amplifier 102 reaches its maximum gain setting, the first, full signal amplifier 101 is enabled (with its gain set to minimum) and its output 113 is summed 110 with the output 114 of the second amplifier 102 thereby increasing the output 112 of the VGA 100.

During the remainder of the control range for the VGA 100, the gain of the first amplifier 101 is increased up to its maximum value with the gain of the second amplifier 102 remaining at its maximum.

This arrangement is scalable with it being possible to add more multipath amplifiers which operate off a range of attenuation outputs from an input network.

Figure 1B:
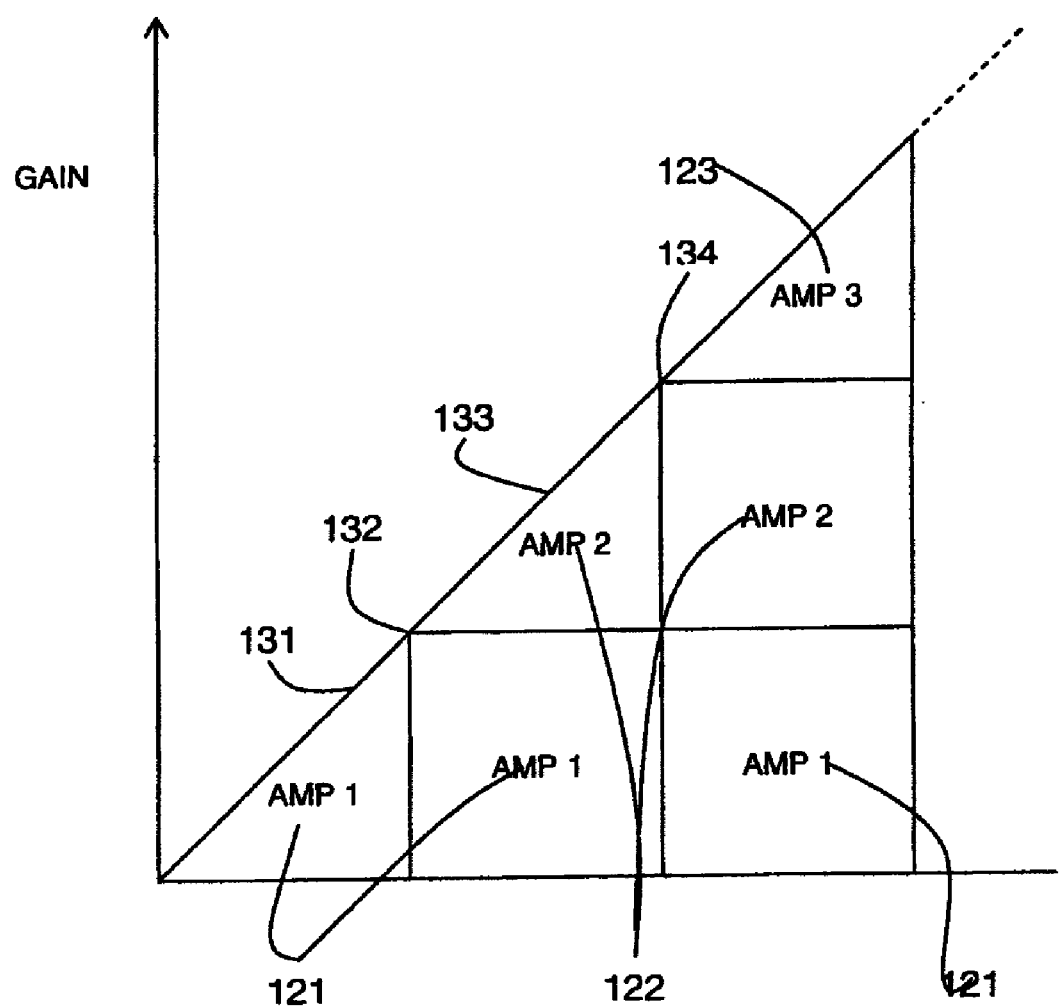
FIG. 1B is a graph showing the gains of amplifier stages in a variable gain amplifier in accordance with the present invention.

FIG. 1B is a graph showing the cumulative gains of a plurality of amplifiers such as the first and second amplifiers 101, 102 of FIG. 1A.

FIG. 1B shows a first amplifier 121 with an attenuated gain 131 starting from a gain of zero and increasing to a maximum gain 132. A second amplifier 122 is then used in addition to the first amplifier 121 and the gain 133 of the second amplifier 122 is added to the maximum gain 132 of the first amplifier 121. The gain 133 of the second amplifier 122 is increased until it reaches a maximum gain 134 for the second amplifier 122. In an embodiment which extends the number of amplifiers from the two shown in FIG. 1a, a third amplifier 123 and subsequent amplifiers can be added. In this way a wide range of gain from attenuation to amplification is enabled.

FIG. 1B shows a constant gradient for the gain as the multiple amplifiers 121, 122, 123 are added; however, in practice due to the varying attenuation of the input signals for the amplifiers, this may not be constant. For example, a more gradual increase in gain over the attenuation range for low gains may be provided with an attenuated input signal for the first amplifier 121.

FIG. 1B shows a linear control law for the gain. This control law could take other forms as long as the control law is continuous.

This arrangement has several advantages in that it allows operation with high input signals at low supply voltages providing that in the high input case the VGA is operating within its attenuation region of gain, which is often the case. Under these circumstances, the active amplifier is not receiving the full input swing facilitating operation at low voltages.

The parallel amplifier topology is also suited to high frequency applications where effects such as output jitter can be significant. Instead of cascading amplifiers in series which is well known to be detrimental to jitter and bandwidth, the multipath arrangement provides increased gain without this degradation. The extension of multipath amplifier design to VGA applications allows the input operating range to be conveniently extended for a given supply voltage. The circuit power can be proportional to the VGA gain and use of parallel stages can ease the implementation of gain control and the minimisation of glitches as the gain is adjusted.

Figure 2:
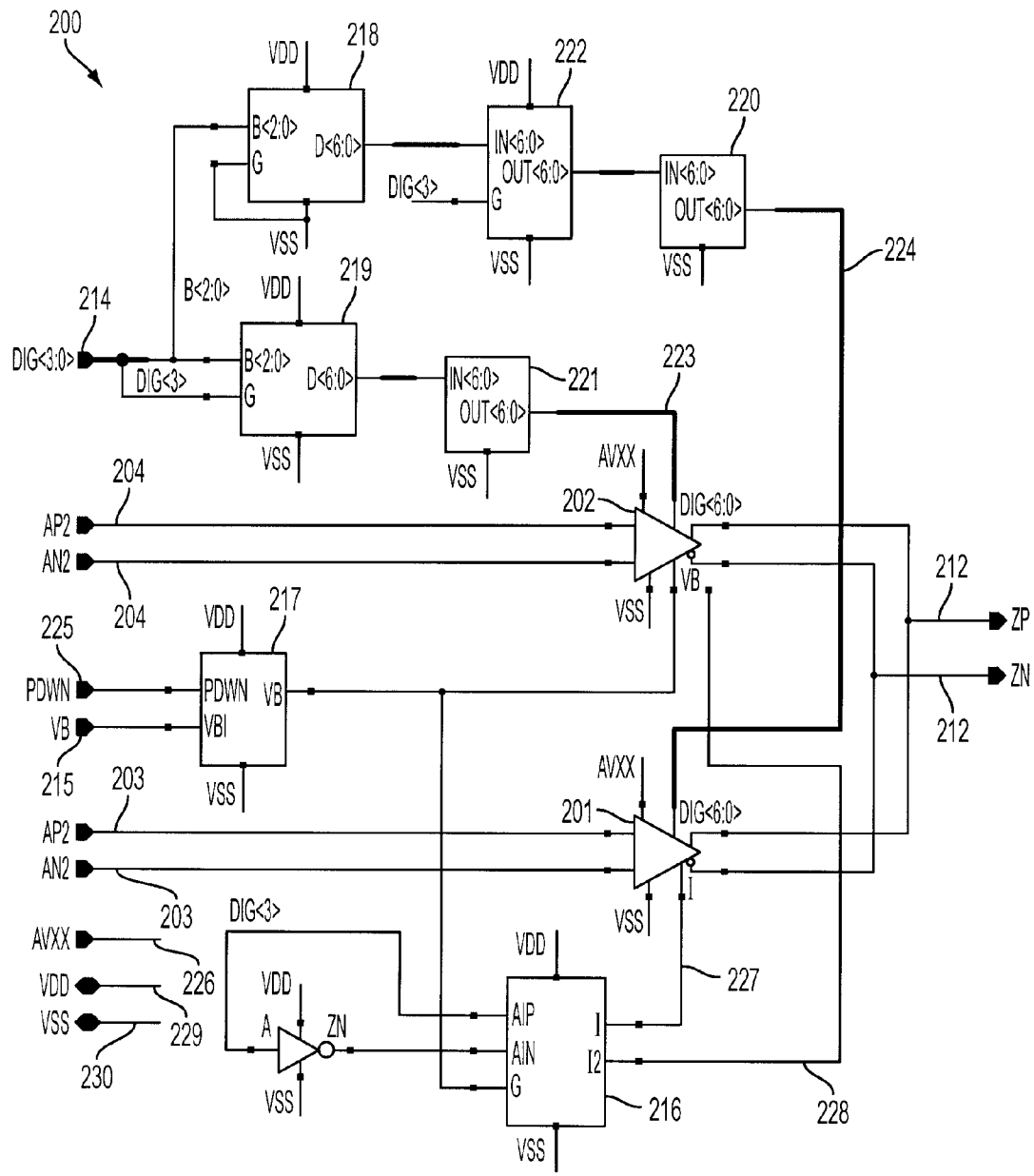
FIG. 2 is a diagram of an implementation of a variable gain amplifier in accordance with the present invention.

A practical implementation of this system is shown in FIG. 2. In this case the multipath VGA 200 is comprised of two channels, the first operating off a full size differential input signal 203 formed by AP/AN and the second operating off a half size input signal 204 formed by AP2/AN2. These signals 203, 204 can be conveniently derived from a resistor input network 105 as shown in FIG. 1A.

Two differential amplifiers 201, 202 provide a current output into a resistor load that can be conveniently connected together to implement the summer function 10 of FIG. 1 producing the VGA outputs 212 of ZP and ZN.

The reference for the current sources used to define the tail current 227, 228 in the amplifier circuits is provided by bias block 217 which uses a reference input voltage VB 215. This bias line is controlled using a current switch 216 into the full signal amplifier 201 such that this channel is only active above certain gain settings of the VGA gain.

The current switch 216 steers the current between the two amplifiers 201, 202. When a high gain is required the full signal amplifier 201 is enabled by providing tail current 227 to that amplifier 201. When the full signal amplifier 201 is not active the current switch 216 steers current 228 into the output of the other amplifier 202 in order to maintain a common mode output.

The VGA 200 has common power supply terminal voltages, the positive supply voltage VDD 229 and the negative supply ground VSS 230.

The ability to power down the VGA using the input PDWN 225 is also controlled through this block 217. A separate low noise supply AVXX 226 is used in this embodiment for the amplifiers 201, 202 to minimise the noise on the signal path.

In this case the VGA gain is set digitally through a four bit gain vector DIG<3:0> 214. This vector 214 is decoded such that the most significant bit is used to switch in the full signal channel. Consequently for gain settings from 0000 to 0111 only the half signal channel is active. At 1000 the full signal channel (at its lowest gain value) is added to the output of the half signal channel which is now maintained at its maximum gain for the remaining VGA gain settings in the range 1000 to 1111. The three least significant bits of the gain vector 214 are fully decoded to control the individual amplifiers 201, 202 using the thermometer decoders 218 and 219.

In this implementation, a first decoder 218 controls the full signal amplifier 201 and the second decoder 219 controls the half signal amplifier 202. In a first range of the VGA 200, the second decoder 219 controls the half signal amplifier 201. During this phase the full signal amplifier 201 is not enabled and therefore the first decoder 218 is not active or is disregarded. When the second decoder 219 reaches a maximum output, a second range of the VGA 200 is entered. The full signal amplifier 201 is enabled and the first decoder 218 drives the full signal amplifier 201. The second decoder 219 is maintained at its maximum output during the second range.

The outputs of the first decoder 218 for the full signal channel are ANDed 222 with the most significant bit of the gain vector 214 such that the decoder outputs are only active for the channel when this bit is set. This enables the lower 3 bits of the 4 bit gain vector to control the full signal amplifier channel when the most significant bit of the gain vector is set to 1.

The outputs of the decoders are filtered using filters 220, 221 before controlling the amplifiers 201, 202. This minimises the disturbance on the output of the VGA 200 as the gain is increased or decreased between adjacent settings of the gain vector 214.

The two decoders 218, 219 could be implemented as a common decoder with further gating provided at the output. Many different implementations of the decode function are possible.

Gain control signals 223, 224 in the form of digital vectors DIG<6:0> as outputs 223, 224 from the decoders are input to the amplifiers 202, 201 via the filters.

In an alternative implementation, the gain control can be provided by equations implemented into the logic of an integrated circuit as hardware description language code.

Figure 3:
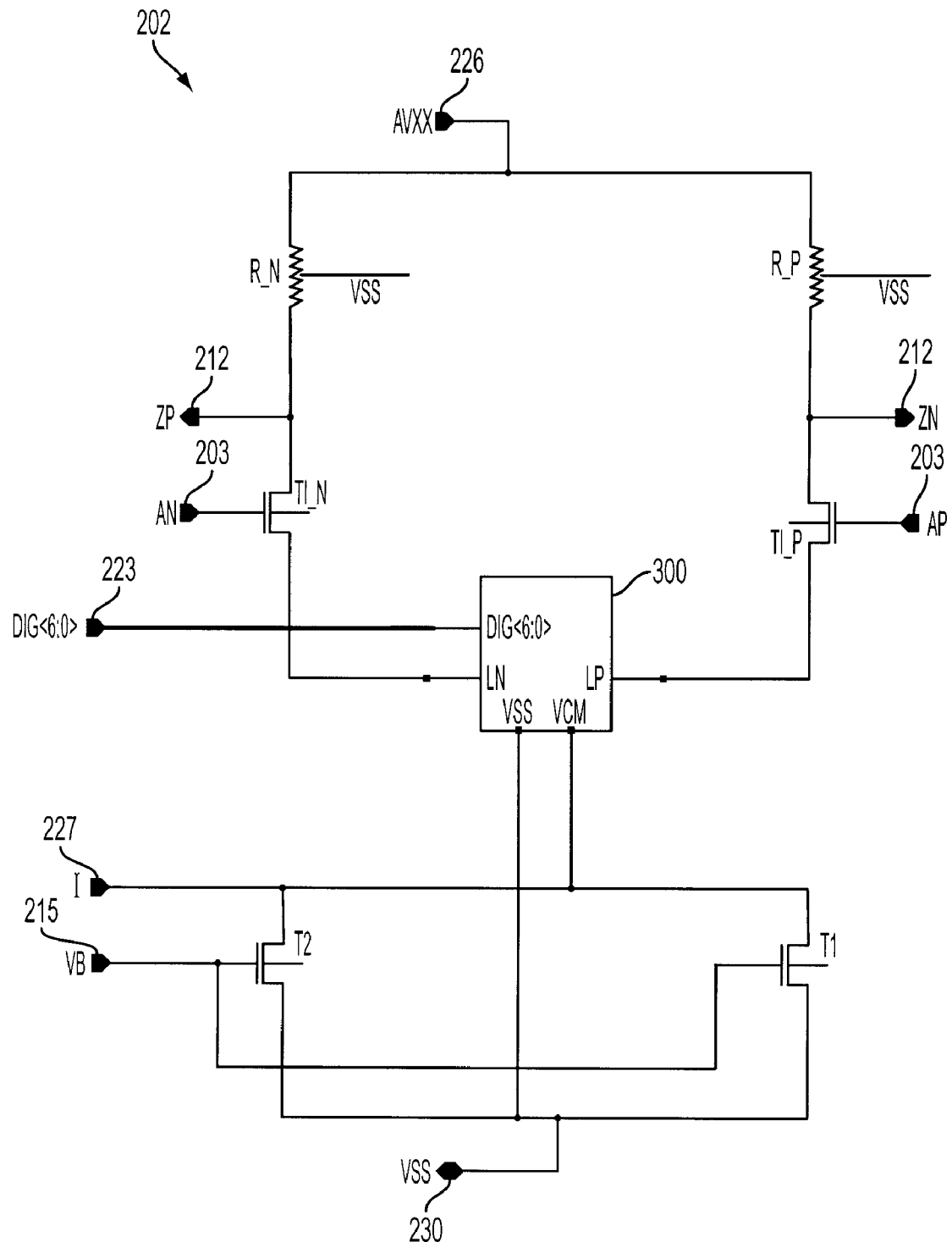
FIG. 3 is a diagram of an attenuated signal amplifier as provided in the variable gain amplifier implementation of FIG. 2.
Figure 4:
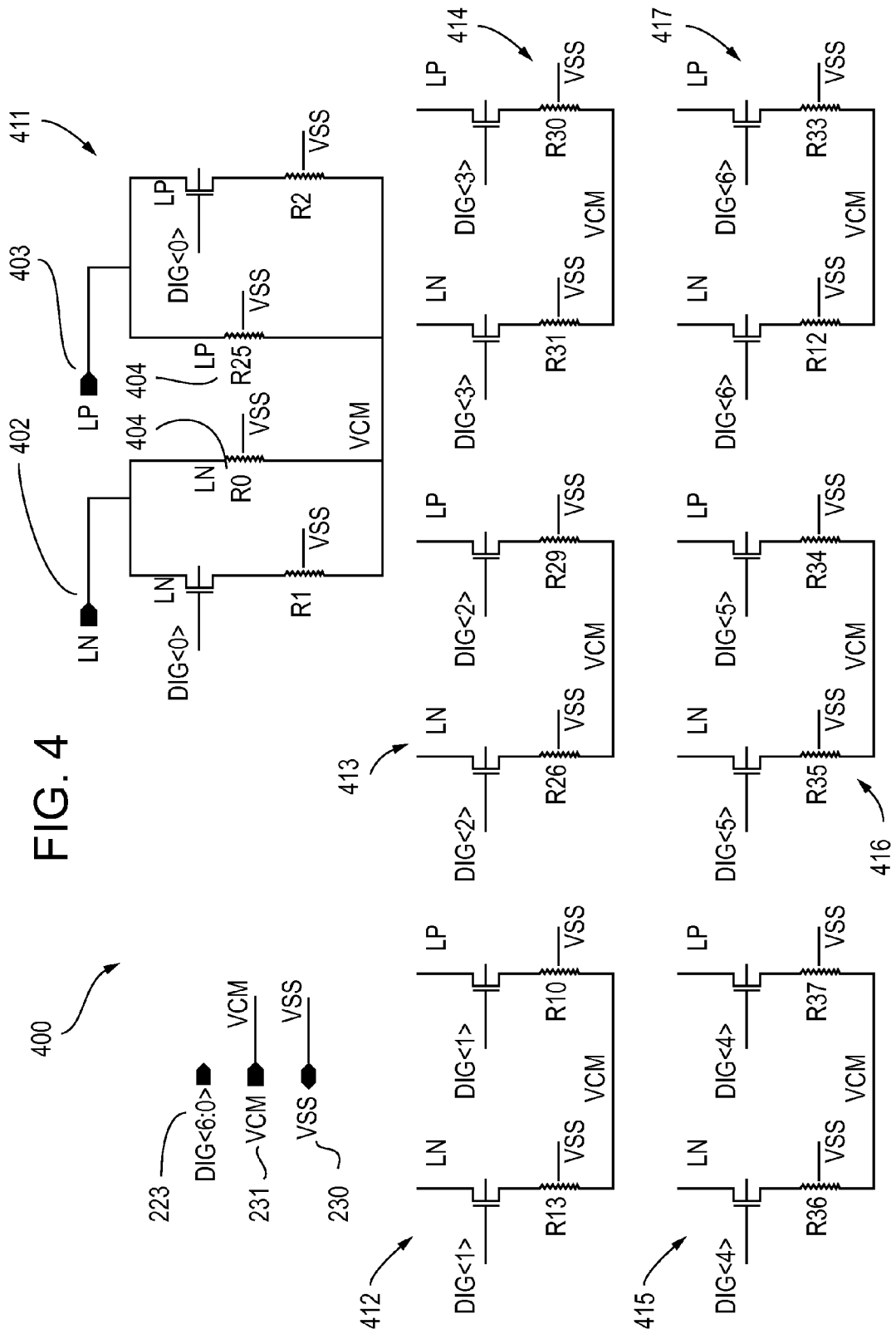
FIG. 4 is a diagram of the gain network for the attenuated signal amplifier of FIG. 3.

The schematic of the half signal channel amplifier 202 of FIG. 2 is shown in FIG. 3. This is a conventional CMOS (complementary metal oxide semiconductor) based differential amplifier using source degeneration to control the gain. The half signal channel amplifier 202 has a gain control 300 controlled from the decoder outputs 223. FIG. 4 shows a network 400 suitable for controlling the gain.

Each decoder output DIG<6:0> connects an impedance between the sources of the amplifier input devices 402, 403 at I_N and I_P. The decoder is essentially a thermometer decoder and as the gain is increased more of the decoder outputs go high switching in additional elements of the network 400 and the impedance across I_N and I_P reduces, thereby increasing gain. FIG. 4 shows seven states 411, 412, 413, 414, 415, 416, 417 for gain settings DIG<0> to DIG<6>.

Conversely as the gain is decreased then elements are switched out of the network 400 increasing the overall impedance and reducing the amplifier gain. The gain of the amplifier 202 is a complex function of the gain network impedance and by having an impedance which is specific to each gain setting (as shown by the seven states in FIG. 4), the control law of the amplifier 202 can be set to the required characteristic. The control law is defined as the amplifier gain versus gain vector setting characteristic.

Another advantage of this arrangement is the incremental change in the network 400 between successive gain setting with just one element being added or removed from the circuit. This minimises the disturbance on the output as the gain of the VGA is incrementally changed which is desirable in certain applications. It is well known that the high frequency performance of the differential amplifier can be improved by optimising the capacitive loading across a degeneration network and the relative position of the FET (field effect transistor) and resistor within each element of the network and their individual sizings can be optimised for amplifier bandwidth.

Figure 5:
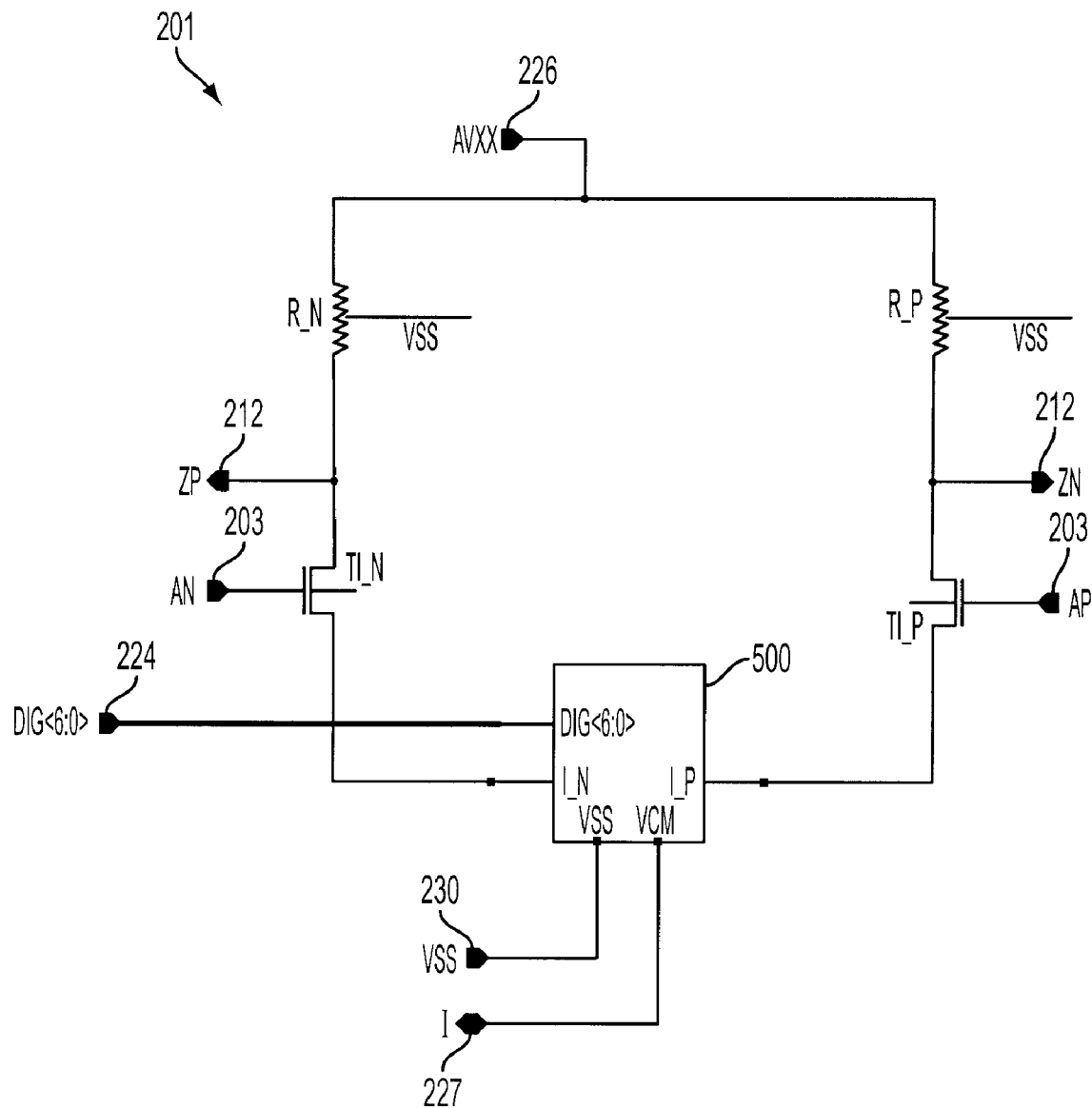
FIG. 5 is a diagram of the full signal amplifier as provided in the variable gain amplifier implementation of FIG. 2.

The schematic of the full signal amplifier 201 of FIG. 2 is shown in FIG. 5. This uses a similar approach having a differential amplifier with source degeneration and a gain control 500 controlled from the decoder outputs 224. A network similar to that shown in FIG. 4 is used to control the gain, the only difference being in the values of the individual elements within the network 400.

Figure 6:
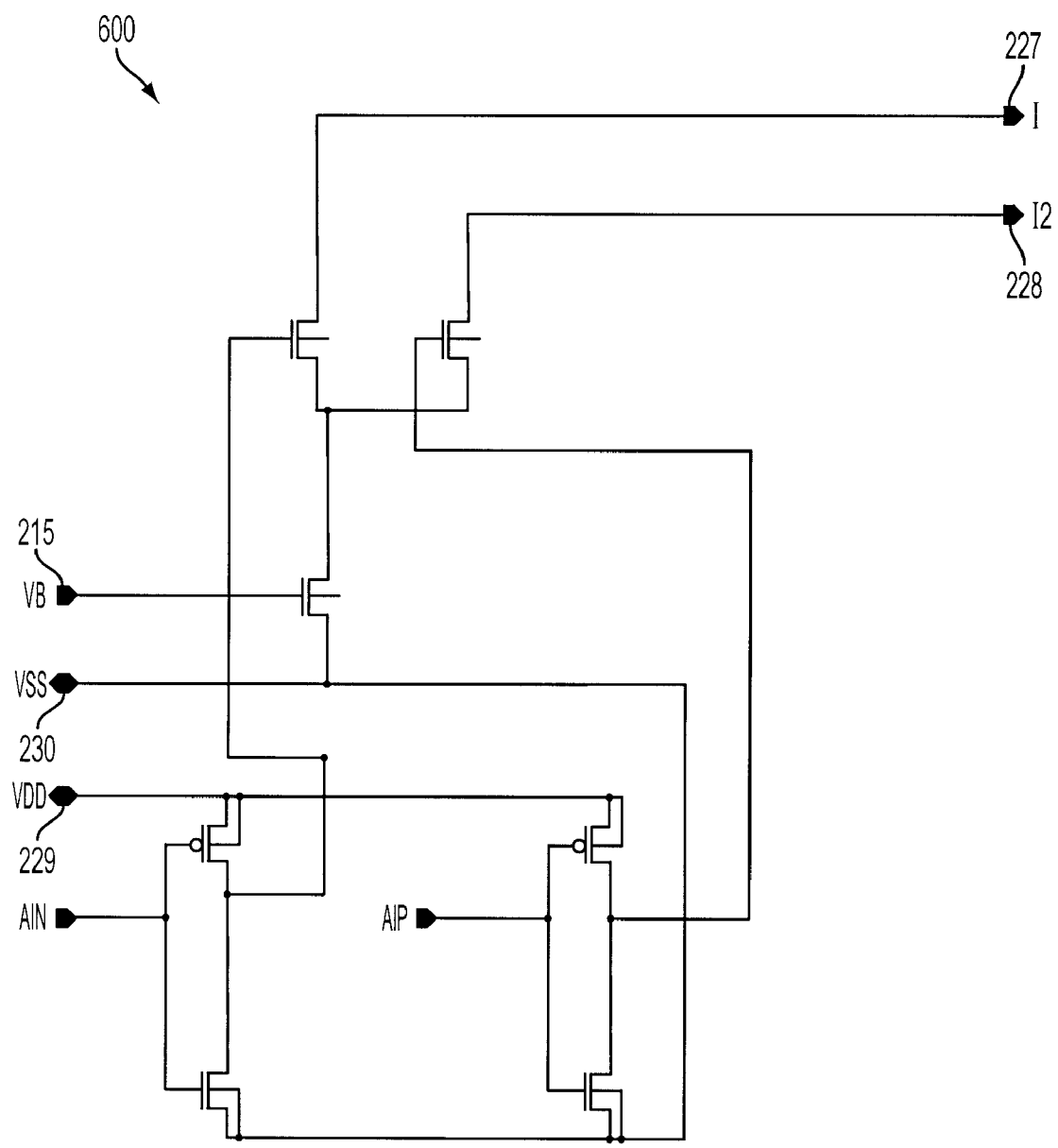
FIG. 6 is a diagram of a mechanism for enabling and disabling the full signal amplifier of FIG. 5.

However, since this channel is only active above a certain value of the gain vector, this amplifier 201 can be disabled using the circuit 600 shown in FIG. 6 which is an implementation of the current switch 216 of FIG. 2.

The circuit 600 is a long tail pair switch which essentially steers current from the tail current source to the load of the amplifier and vice-versa as the amplifier 201 is disabled and enabled respectively.

In this way, the common mode output of the VGA is maintained. This is important on low voltage designs where large common mode variation is not possible.

Since the summing function on the output of this multipath amplifier arrangement is performed by connecting together the current outputs of each differential amplifiers 201, 202, it becomes even more important to maintain the common mode voltage at the output as amplifiers are switched in an out. It is well known that large changes in the common mode voltage output of an amplifier can have a detrimental effect on its own performance and that of successive stages.

Figure 7:
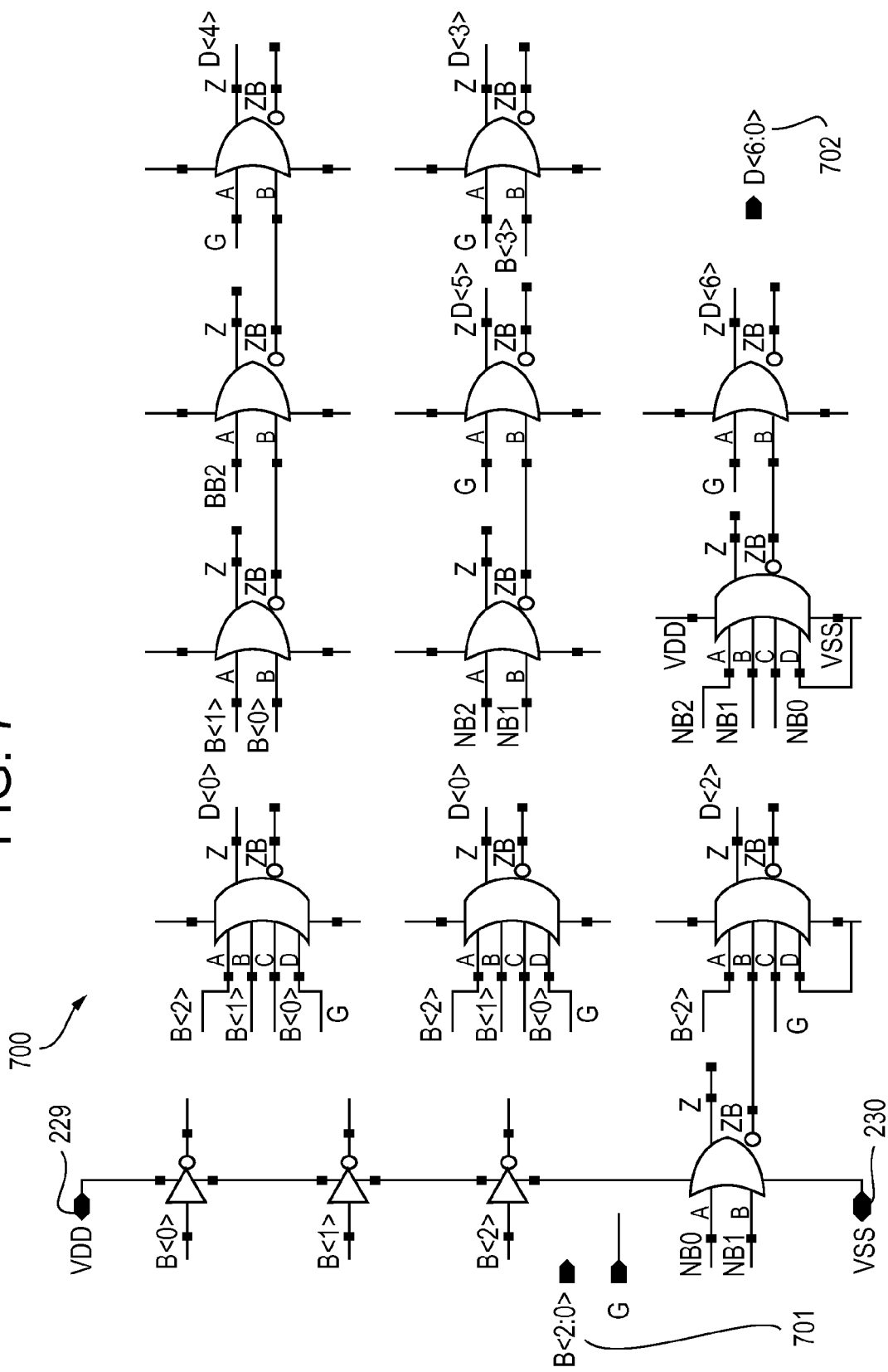
FIG. 7 is a diagram of a gain decoder as provided in the variable gain amplifier implementation of FIG. 2.

An implementation 700 of the decoder 218 of FIG. 2 is shown in FIG. 7. In this embodiment, a 3 bit wide digital vector 701 is converted into 7 control lines 702 for the network 400 shown in FIG. 4. With the 3 bit vector at 000, all outputs are at 0 but the gain network has an unswitched element (reference 404 in FIG. 4) which provides the minimum gain setting. As the gain vector moves from 001 to 111 the outputs D<6:0> progressively turn on starting with 0000001 and finishing at 1111111. The design of such decoders is well known and FIG. 7 represents one possible implementation 700.

Figure 8:
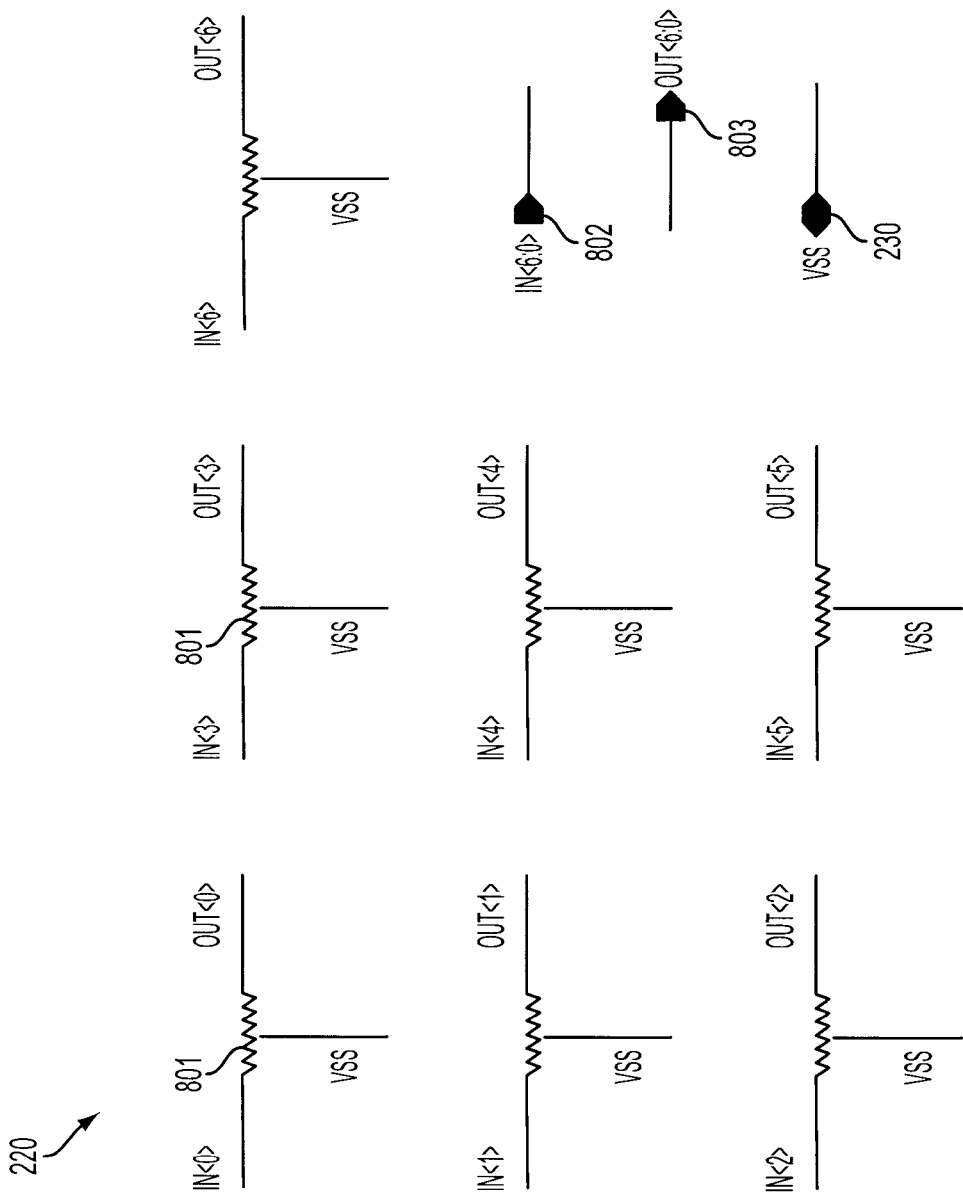
FIG. 8 is a diagram of a filter as provided in the variable gain amplifier implementation of FIG. 2.

Filters 220, 221 are used between the decoders 218, 219 and the amplifier gain control networks 400 to avoid any glitches from the decoder 218, 219 coupling into the signal path of the VGA. A schematic for a filter 220 is shown in FIG. 8 and essentially this is just a bank of resistors 801 which are inline with each decoder output. The decoder has an input 802 and an output 803 into and out of the filter 220. The resistors 801 form a low pass RC filter working with the input capacitance of the gain control network 400 which is predominantly formed by the input gate capacitance of the switch FET (field effect transistor). Again this filter 220 is implementation specific, depending on the design of the decoder and the performance specification it may not be required.

The described embodiments provide a variable gain amplifier in which n multiple amplifier stages are used with a range of fractional input signals. Specifically described are two amplifier stages, one with a full signal and one with an attenuated half signal. This is an optimum arrangement for one application in which a very high bandwidth must be accommodated.

The described arrangement is scaleable using a range of fractional inputs to drive the inputs. Different ratios of signals may also be used. It is envisaged that other applications may require multiples of the full signal to be used for one or more amplifier stages. It is also possible for the amplifier stages to all have attenuated signals with no full signal input, if an application has this requirement. It is also possible that one amplifier stage can have a fixed gain with one or more other amplifier stages having variable gain. All these variations to the described embodiment fall within the scope of the present invention.

The described embodiments of the amplifier array have an amplifier output with a voltage output with a common mode of voltage maintained. The described arrangement could equally be applied to an amplifier array with a current output, for example a trans-conductance amplifier, in which an average current is maintained at the output.

The described variable gain amplifier has the following advantages over known devices.

At minimum gain which implies maximum input signal, the input stage of the VGA does not have to handle the full input swing which can be a problem with low voltage designs. An input attenuator is used to reduce this signal for the first amplifier in the multipath arrangement.

As the gain is increased, parallel amplifiers are summed together to provide the VGA output, in this way the gain of the VGA can be greater than an individual amplifier. Although a similar result can be obtained by cascading amplifiers in series, a parallel combination can provide advantages over this arrangement in terms of distortion and reduction in the jitter introduced on the signal passing through the VGA.

The parallel approach with parallel amplifiers being switched in or out of the signal path as the gain is respectively increased or decreased can be an advantage in reducing the disturbance that occurs on the VGA output as the gain is progressively changed. Within many AGC applications, it is important to minimise the disturbance on the VGA output, which could be in the form of signal glitches, for example, as the gain is changed from one setting to the next. In the multipath arrangement the parallel amplifiers can be slowly switched in or out of circuit as the gain range is traversed with minimal disturbance on the output.

The implementation of the gain control network by the progressive addition or subtraction of elements through a parallel or series combination is advantageous. In this way the disturbance on the total network impedance and hence circuit output can be minimised between adjacent gain control settings. In the scheme described this is achieved using a thermometer decoder on the digital gain control to control parallel elements in the gain control network. This is a desirable feature in many VGA applications, for example, an AGC loop, where gain is typically swept between the initial and final values and the output should smoothly follow the gain changes without any other disturbance such as signal glitches.

The described system also has the ability to use the configuration of the gain control network to implement a chosen control law for the gain versus control setting characteristic. Since the network value is autonomous for each setting, the only constraint is that it is continuous, the control law can be tailored to the required characteristic. For example, a linear control law may be required in which the gain changes linearly with respect to the setting characteristic. As another example, the control law may be logarithmic. The control law can be any form of a curve which is continuous in that the change is progressive with no reverses.

Another advantageous feature is the optimisation of the gain control network such that the bandwidth of the amplifier is also optimised using the parasitic capacitance associated with the network to introduce peaking in the amplifier. In this way, the peaking contribution can also be changed for individual gain settings.

This arrangement is suited to low power solutions since the total circuit power could be reduced with decreasing gain with the unused parallel amplifiers being disabled. In this way the power could be made proportional to gain.

The method of disabling an amplifier channel in a multipath configuration by steering current between the source and drain of the input devices of the amplifier is also beneficial. An embodiment of this principle is shown in FIGS. 5 and 6. This allows the common mode at the output of the amplifier to be maintained which is important for many applications. It is especially desirable in the multipath amplifier configuration as it allows multiple amplifier outputs to be directly connected together without the common mode of the combined output changing significantly as individual channels are switched in and out.

Finally, the VGA scheme described can employ either digital or analog control of gain. Although the implementation described uses digital control, a linear scheme could be simply implemented using linear degeneration networks at each amplifier stage. Linear control of the switching in and out of the parallel amplifiers is also feasible using linear control of the current switch. However, in many applications when linear control is required this is a 'fine' adjustment of a main digital control, this could be easily implemented with a simple linear degeneration at an amplifier stage.

Improvements and modifications can be made to the foregoing without departing from the scope of the present invention.

We claim:

1. An amplifier array comprising:
   at least two amplifier stages connected in parallel;
   each amplifier stage having a gain controller; an input signal for each amplifier stage, each of said input signals of the amplifier stages being of different amplitude;
   an enabler and disabler for each amplifier stage;
   a tool to aggregate outputs of said enabled amplifier stages to obtain an output signal; and
   a control law adapted to be implemented for amplitude gain versus a control characteristic of gain.

2. The amplifier array of claim 1, further comprising maintenance of a common mode at an output of said amplifier array.

3. The amplifier array of claim 2, wherein maintenance of said common mode includes steer of current between a source and a drain of said amplifier stage.

4. The amplifier array of claim 1, further comprising a total gain of said amplifier array having a range from a low gain setting with said first amplifier stage enabled to an increased gain setting as gain from said first amplifier stage is increased from a minimum gain to a maximum gain.

5. The amplifier array of claim 1, further comprising said second amplifier stage adapted to be enabled in addition to said first amplifier stage, and gain of said second amplifier stage having a gain increased from a minimum setting to a maximum setting.

6. The amplifier array of claim 1, wherein said first amplifier stage having a most attenuated input signal for said low gain setting.

7. The amplifier array of claim 1, wherein each amplifier stage includes a decreasingly attenuated input signal and a final enabled amplifier stage having a full input signal.

8. The amplifier array of claim 1, wherein a value of said gain control is autonomous for each characteristic and said law is continuous.

9. The amplifier array of claim 1, wherein said gain control of an amplifier stage may optimize bandwidth of said amplifier array through an introduction of peaking in said array and to support a change in peaking for each gain setting.

10. The amplifier array of claim 1, wherein said input signal includes means adapted to increase attenuation of said input signal to said amplifier stages.

11. The amplifier array of claim 10, wherein said input signal means is selected from a group consisting of: a parallel divider network, and a line termination.

12. The amplifier array of claim 1, wherein said amplifier stage is a differential amplifier and said gain controller of each amplifier may include a source degeneration.

13. The amplifier array of claim 1, wherein the gain controller gain of said amplifier stages is adapted to include a process selected from the group consisting of: optimization of bandwidth of an associated amplifier, source degeneration, and progressive addition and subtraction of elements through a parallel and series combination to change impedance of a network.

14. The amplifier array of claim 1, wherein said gain controller is a digital gain vector adapted to obtain an output.

15. The amplifier array of claim 14, further comprising a filter adapted to parse said output to minimize disturbance on said output as gain is changed between settings of said gain vector.

16. An amplifier array comprising:

at least two amplifier stages connected in parallel;

each amplifier stage having a gain controller, with at least one of said amplifier states having a most attenuated signal for a low gain setting, wherein a gain controller of said first amplifier stage is adapted to increase a gain of said first amplifier stage to a maximum and a gain controller of said second amplifier stage is adapted to increase an associated gain up to a maximum;

an input signal for each amplifier stage, each of said input signals of the amplifier stages being of different amplitude;

an enabler and disabler for each amplifier stage; and a tool to aggregate outputs of said enabled amplifier stages to obtain an output signal.

17. An article comprising:

an amplifier array having at least two amplifier stages connected in parallel;

each of said amplifier states having gain control means, wherein at least one of said gain control means is a digital gain vector adapted to obtain an output;

input means for each amplifier state;

input signals of each of said amplifier state being of different amplitude;

means for enabling and disabling each of said amplifier stages; and means for summing output of enabled amplifier stages to obtain an output signal.

\* \* \* \* \*